(12) United States Patent
Zhang et al.

(10) Patent No.: US 6,753,115 B2
(45) Date of Patent: Jun. 22, 2004

(54) FACILITATING MINIMUM SPACING AND/OR WIDTH CONTROL OPTICAL PROXIMITY CORRECTION

(75) Inventors: Youping Zhang, Newark, CA (US); Christophe Pierrat, Santa Clara, CA (US)

(73) Assignee: Numerical Technologies, Inc., San Jose, CA (US)

( * ) Notice: Subject to any disclaimer, the term of this patent is extended or adjusted under 35 U.S.C. 154(b) by 249 days.

(21) Appl. No.: 10/029,041

(22) Filed: Dec. 20, 2001

(65) Prior Publication Data

US 2003/0118917 A1 Jun. 26, 2003

(51) Int. Cl.[7] .......................... G03F 9/00; G06F 17/50
(52) U.S. Cl. ............................................ 430/5; 716/19
(58) Field of Search ...................... 430/5, 322; 716/19, 716/20, 21

(56) References Cited

U.S. PATENT DOCUMENTS

| | | | |
|---|---|---|---|
| 5,631,110 A | 5/1997 | Shioiri et al. ................... 430/5 |
| 5,682,323 A | 10/1997 | Pasch et al. ................ 364/491 |
| 5,723,233 A | 3/1998 | Garza et al. .................... 430/5 |
| 5,815,685 A | 9/1998 | Kamon ....................... 395/500 |
| 5,825,647 A | 10/1998 | Tsudaka ................ 364/167.03 |
| 5,991,006 A | 11/1999 | Tsudaka ....................... 355/53 |
| 6,014,456 A | 1/2000 | Tsudaka ..................... 382/144 |
| 6,081,658 A | 6/2000 | Rieger et al. .......... 395/500.22 |
| 6,154,563 A | 11/2000 | Tsudaka ..................... 382/144 |
| 6,243,855 B1 | 6/2001 | Kobayashi et al. ........... 716/19 |
| 6,249,597 B1 | 6/2001 | Tsudaka ..................... 382/144 |
| 6,289,499 B1 | 9/2001 | Rieger et al. ................. 716/21 |
| 6,298,473 B1 | 10/2001 | Ono et al. .................... 716/21 |
| 6,453,457 B1 | 9/2002 | Pierrat et al. ................. 716/19 |
| 6,574,784 B1 * | 6/2003 | Lippincott et al. ............. 716/8 |
| 2002/0091985 A1 * | 7/2002 | Liebmann et al. ............ 716/19 |
| 2002/0100004 A1 | 7/2002 | Pierrat et al. ................... 716/5 |

FOREIGN PATENT DOCUMENTS

| | | |
|---|---|---|
| GB | 2324169 A | 10/1998 |
| JP | 3-80525 | 4/1991 |
| WO | WO 00/67074 A1 | 11/2000 |

OTHER PUBLICATIONS

Cobb, N., et al., "Fast, Low–Complexity Mask Design", SPIE, vol. 2440, pp. 313–327, Feb. 22–24, 1995.
Cobb, N., et al., "Experimental Results on Optical Proximity Correction With Variable Threshold Resist Model", SPIE, vol. 3051, pp. 458–468, Mar. 12–14, 1997.
Cobb, N., "Fast Optical and Process Proximity Correction Algorithms for Integrated Circuit Manufacturing", Dissertation, University of California at Berkeley, UMI Microform 9902038 (139 pages).

(List continued on next page.)

*Primary Examiner*—S. Rosasco
(74) *Attorney, Agent, or Firm*—Park, Vaughan & Fleming LLP

(57) ABSTRACT

One embodiment of the invention provides a system that facilitates minimum spacing and/or width control during an optical proximity correction operation for a layout of a mask used in manufacturing an integrated circuit. During operation, the system considers a target edge of a first feature on the mask and then identifies a set of interacting edges in proximity to the target edge. Next, the system performs the optical proximity correction operation, wherein performing the optical proximity correction operation involves applying a first edge bias to the target edge to compensate for optical effects in a resulting image of the target edge. While applying the first edge bias to the target edge, the system allocates an available bias between the first edge bias for the target edge and a second edge bias for at least one edge in the set of interacting edges.

32 Claims, 13 Drawing Sheets

OTHER PUBLICATIONS

Toublan, O., et al., "Phase Aware Proximity Correction for Advanced Masks", SPIE, vol. 4000, pp. 160–170, Mar. 1–3, 2000.F Anonymous, "Parameterization For Full Shape And Rule Dependent: Dissection", IPCOM000009587D, Sep. 4, 2002 (9 pages).

Ackmann, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

Lithas, "Lithas: Optical Proximity Correction Software" (2 pages).

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Compnay, Hewlett Packard Labs (9 pages).

Sugawara, M., et al., "Practical Evaluation of Optical Proximity Effect Correction by EDM Methodology", Sony Corporation (11 pages).

Saleh, B., et al., "Reductions of Errors of Microphotographic Reproduction by Optimal Corrections of Original Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R., et al., "Optical Proximity Effect Correction: An Emerging Technology", Microlithography World, pp. 6–12 (1994).

Barouch, E., et al., "OPTIMASK: An OPC Algorithm for Chrome and Phase–Shift Mask Design", SPIE, Vo. 2440, pp. 192–206, Feb. 1995.

Yen, A., et al., "Characterization and Correction of Optical Proximity Effects in Deep–Ultraviolet Lithography Using Behavior Modeling", J. Vac. Sci. Technol. B, vol. 14, No. 6, pp. 4175–4178, Nov./Dec. 1996.

Morimoto, H., et al., "Next Generation Mask Strategy—Technologies are Ready for Mass Production of 256M DRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Application of a Simple Resist Model to Fast Optical Proximity Correction", SPIE, vol. 3051, pp. 774–780 (1997).

Chuang, H., et al., "Practical Applications of 2–D Optical Proximity Corrections for Enhanced Performance of 0.25um Random Logic Devices", IEEE, pp. 18.7.1–18.7.4, Dec. 1997.

Asai, N., et al., "Proposal for the Coma Aberration Dependent Overlay Error Compensation Technology", Jpn. J. Appl. Phys., vol. 37, pp. 6718–6722 (1998).

* cited by examiner

FACILITATING MINIMUM SPACING AND/OR WIDTH CONTROL OPTICAL PROXIMITY CORRECTION

BACKGROUND

1. Field of the Invention

The invention relates to the process of designing and fabricating semiconductor chips. More specifically, the invention relates to a method and an apparatus that facilitates minimum spacing and/or width control during an optical proximity correction process for a mask that is used in manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source, an ultraviolet light source, or more generally some other type of electromagnetic radiation together with suitably adapted masks and lithography equipment.

This light is reduced and focused through an optical system that contains a number of lenses, filters and mirrors. The light passes through the clear regions of the mask and exposes the underlying photoresist layer. At the same time, the light is blocked by opaque regions of the mask, leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback". For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates a printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening. This line end shortening is due to optical effects that cause the light to expose more of the resist under a line end than under other portions of the line.

In order to compensate for line end shortening, designers often add additional features, such as "hammer heads," onto line ends (see top portion of FIG. 2). The upper portion of FIG. 2 illustrates a transistor with a polysilicon line 202, running from left to right, which forms a gate region used to electrically couple an upper diffusion region with a lower diffusion region. A hammer head 204 is included on the end of polysilicon line 202 to compensate for the line end shortening. As is illustrated in the bottom portion of FIG. 2, these additional features can effectively compensate for line end shortening in some situations.

These additional features are typically added to a layout automatically during a process known as optical proximity correction (OPC). For example, FIG. 3 illustrates line end geometry 302 (solid line) prior to OPC and the resulting corrected line end geometry 304 after OPC (dashed line). Note that the corrected line end geometry 304 includes regions with a positive edge bias in which the size of the original geometry 302 is increased, as well as regions of negative edge bias in which the size of the original geometry 302 is decreased.

Unfortunately, the OPC process for a given edge typically does not take into account the amount of correction of neighboring edges, which can be located in the same feature or in different features. For example, a positive bias for a given edge can possibly cause a violation of a minimum spacing requirement between the given edge and an edge of a neighboring feature. In another example, a negative bias for a given edge can cause a violation of a minimum width requirement between the given edge and an opposing edge of the same geometric feature (see FIG. 9).

Undesirable effects caused by these interactions can be mitigated through a subsequent design rule checking (DRC) operation that takes place after the OPC process. However, this subsequent DRC operation takes place without the benefit of information that is available during the OPC process. Hence, modifications made by the subsequent DRC operation may adversely effect corrections made during the OPC process. For example, in FIG. 4A, an OPC process causes hammerheads 404 and 414 to be added to line ends 402 and 412, respectively. A subsequent DRC operation detects a minimum spacing violation between hammerheads 404 and 414, and corrects this violation by cutting away portions 406 and 416 from hammerheads 404 and 414. However, these corrections also adversely affect the optical proximity correction.

Undesirable effects caused by these interactions can also be mitigated during the OPC process. In some systems, when the OPC process detects a spacing constraint violation the OPC process simply stops and does not add an optical proximity correction or adds a scaled back optical proximity correction. For example, referring to FIG. 4B, the OPC process successfully places a hammerhead 404 on line 402. However, when the OPC process subsequently attempts to place a hammerhead on line end 412 a minimum spacing violation is detected, and no hammerhead is placed since there is not enough room for the correction. Note that this outcome results in an undesirable asymmetry between the resulting images of line ends 402 and 412.

What is needed is a method and an apparatus that facilitates minimum spacing and/or width control without adversely affecting corrections made by the optical proximity correction process.

SUMMARY

One embodiment of the invention provides a system that facilitates minimum spacing and/or width control during an optical proximity correction operation for a layout of a mask used in manufacturing an integrated circuit. During operation, the system considers a target edge of a first feature on the mask and then identifies a set of interacting edges in proximity to the target edge. Next, the system performs the optical proximity correction operation, wherein performing the optical proximity correction operation involves applying a first edge bias to the target edge to compensate for optical effects in a resulting image of the target edge. While applying the first edge bias to the target edge, the system allocates an available bias between the first edge bias for the target edge and a second edge bias for at least one edge in the set of interacting edges.

In a variation on this embodiment, applying the first edge bias can involve adding a positive edge bias that increases the size of the first feature or adding a negative edge bias that decreases the size of the first feature.

In a variation on this embodiment, the second edge belongs to a second feature so that the distance between the target edge and the second edge defines a distance between the first feature and the second feature. In this variation, applying the first edge bias to the target edge involves satisfying a minimum spacing requirement between the target edge and the second edge. In a further variation, applying the first edge bias to the target edge additionally involves satisfying a minimum width requirement between the target edge and an opposing edge of the first feature.

In a variation on this embodiment, the second edge is also an edge of the first feature so that a distance between the target edge and the opposing edge defines a distance across a gap between portions of the first feature.

In a variation on this embodiment, the second edge is an opposing edge of the first feature so that a distance between the target edge and the opposing edge defines a width of the first feature. In this variation, applying the first edge bias to the target edge involves satisfying a minimum width requirement for the first feature between the target edge and the second edge.

In a variation on this embodiment, applying the first edge bias to the target edge involves considering an edge type of the target edge and considering an edge type of the second edge.

In a variation on this embodiment, allocating the available bias between the target edge and the second edge involves ensuring that the first edge bias of the target edge satisfies a minimum spacing requirement between the target edge and each edge in the set of interacting edges.

In a variation on this embodiment, allocating the available bias between the target edge and the second edge involves ensuring that the first edge bias of the target edge satisfies a minimum width requirement between the target edge and each edge in the set of interacting edges.

In a variation on this embodiment, the available bias is allocated based on relative weights assigned to the target edge and the second edge.

In a variation on this embodiment, allocating the available bias involves iteratively updating bias allocated to the target edge and the second edge in a manner that satisfies minimum spacing requirements or minimum width requirements.

DETAILED DESCRIPTION

Wafer Fabrication Process

Figure 5:
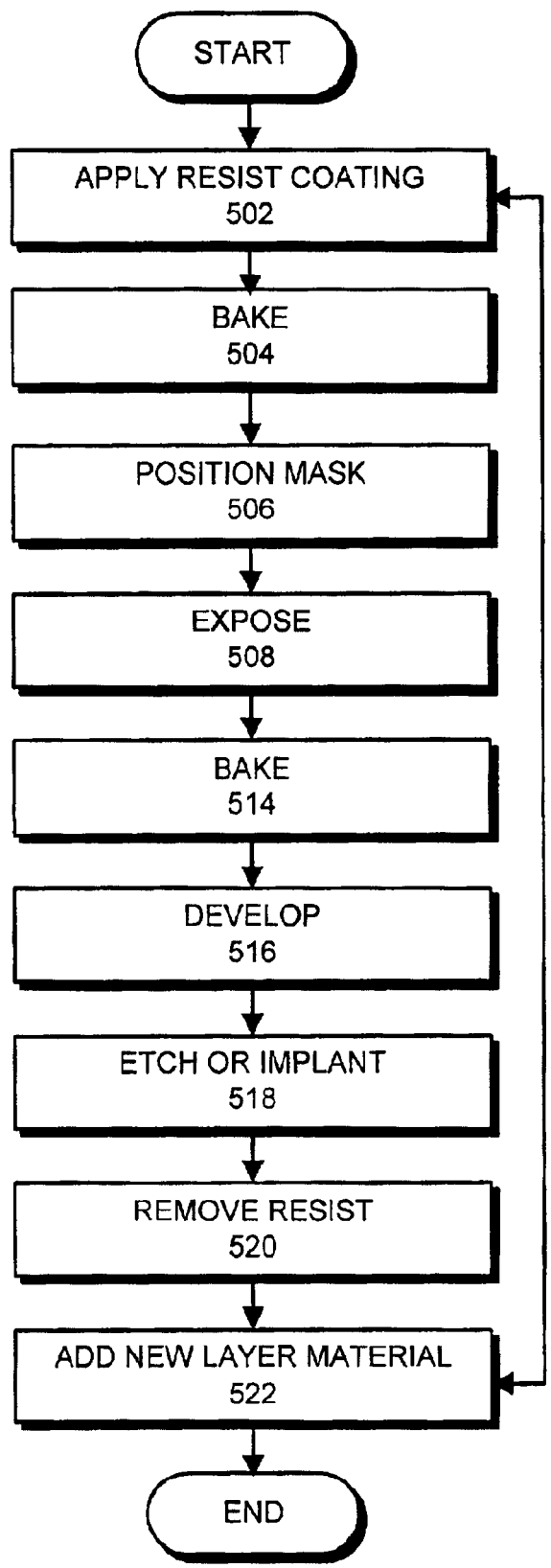
FIG. 5 is a flow chart illustrating the wafer fabrication process in accordance with an embodiment of the invention.

FIG. 5 is a flow chart illustrating the wafer fabrication process in accordance with an embodiment of the invention. The system starts by applying a photoresist layer to the top surface of a wafer (step 502). Next, the system bakes the photoresist layer (step 504). The system then positions a mask over the photoresist layer (step 506), and then exposes the photoresist layer through the mask (step 508). Next, the system optionally bakes the wafer again (step 514) before developing the photoresist layer (step 516). Next, either a chemical etching or ion implantation step takes place (step 518) before the photoresist layer is removed (step 520). (Note that in the case of a lift-off process, a deposition can take place.) Finally, a new layer of material can be added and the process can be repeated for the new layer (step 522).

Design Process

Figure 6:
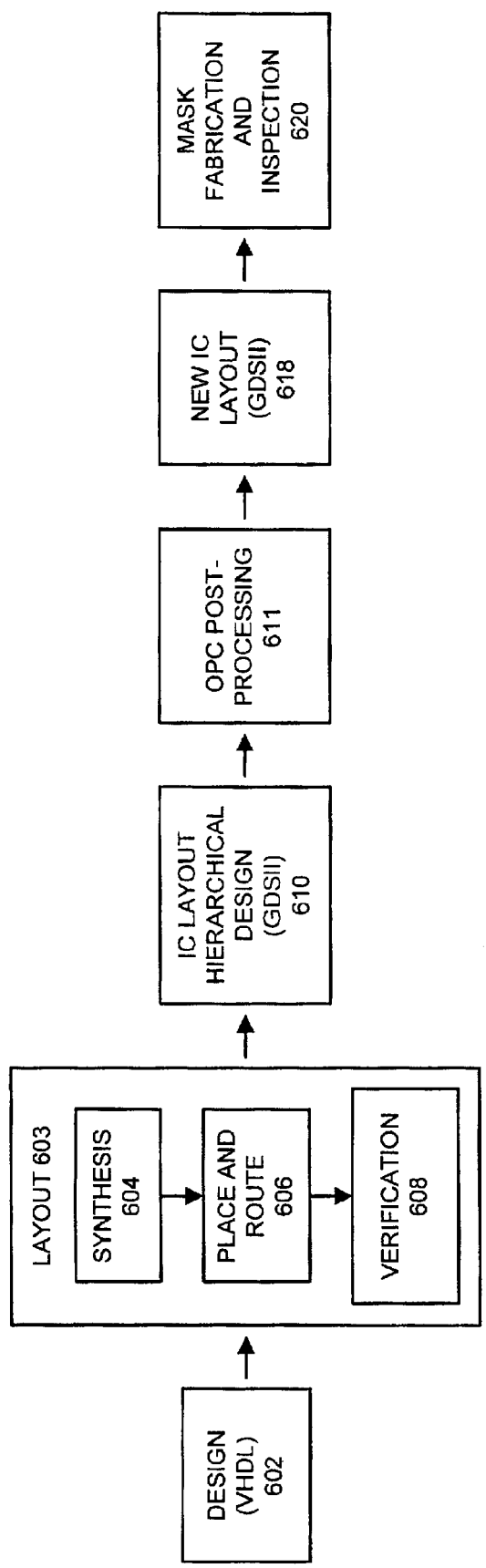
FIG. 6 illustrates the process of creating a mask to be used in fabricating an integrated circuit in accordance with an embodiment of the invention.

FIG. 6 illustrates the process of creating a mask to be used in the wafer fabrication process described above in accordance with an embodiment of the invention. The process starts when a circuit designer produces a design 602 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Layout 602 then feeds through a layout system 603 that performs a number of functions, such as synthesis 604, placement and routing 606 and verification 608. The result is an integrated circuit (IC) layout 610, which is in the form of a hierarchical specification expressed in a format such as GDSII.

IC layout 610 then passes into OPC post-processing system 611, which performs optical proximity corrections to compensate for proximity (can be optical or other) effects during the photolithography process.

The output of OPC post-processing system 611 is a new IC layout 618. New IC layout 618 subsequently passes into mask fabrication and inspection processes 620.

Optical Proximity Correction

Figure 7:
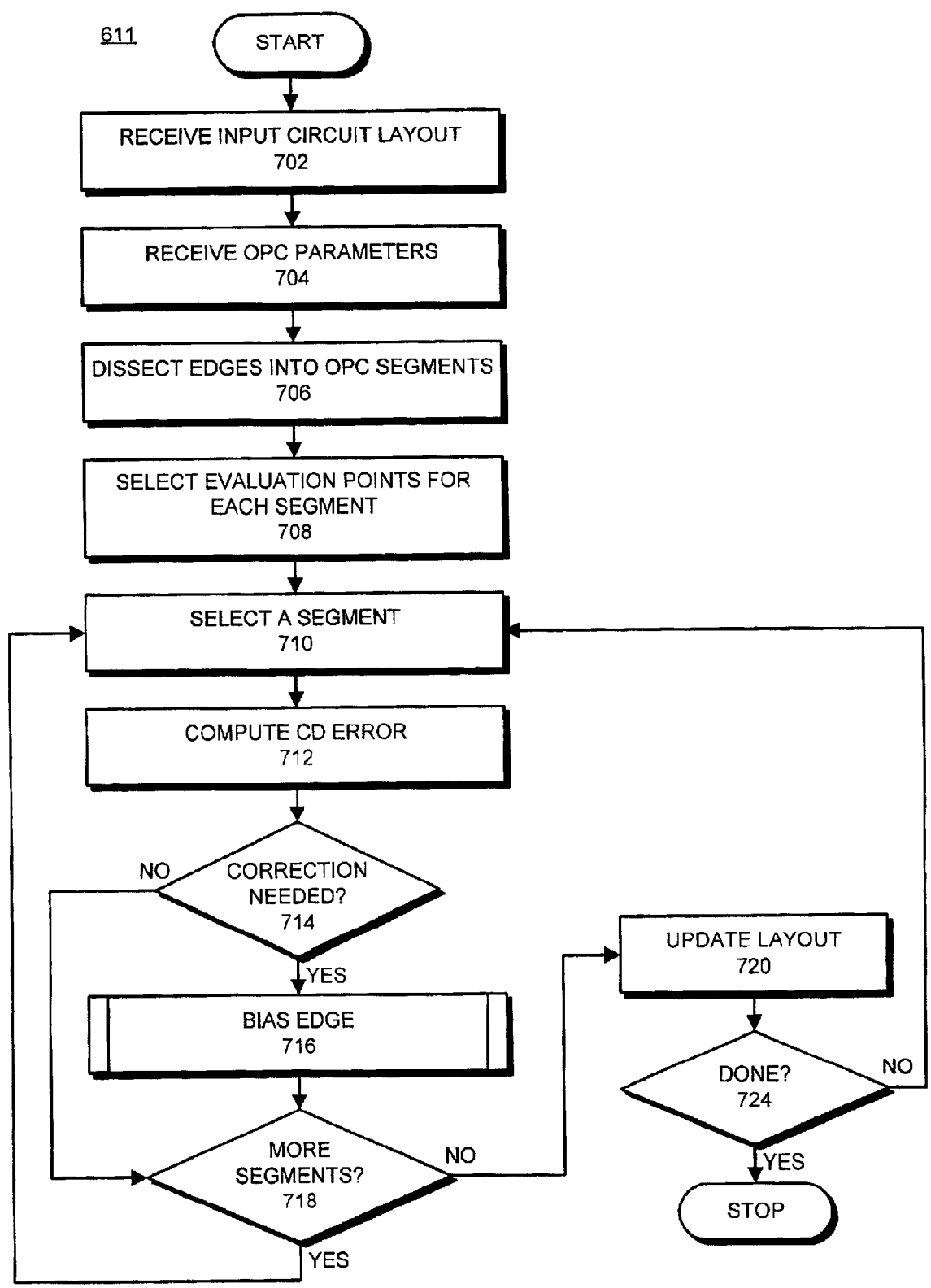
FIG. 7 is a flowchart illustrating the optical proximity correction process in accordance with an embodiment of the invention.

FIG. 7 is a flowchart illustrating an optical proximity correction process which takes place in box 611 of FIG. 6 in accordance with an embodiment of the invention. The process starts when the system, such as a computer system, receives an circuit layout requiring optical proximity correction (OPC) (step 702). This circuit layout can be received in a standard format, such as GDSII format, mask electronic beam exposure system (MEBES) format, and/or some other format. The input circuit layout can be received by the system over a network, such as a local area network, the Internet, a network attached storage network or from storage local to the system, such as a hard drive, CD-ROM, or DVD.

Next, the system receives OPC parameters for evaluating the input circuit layout (step 704). In one embodiment of the invention, the system receives OPC parameters from a user through a graphical user interface (GUI). In another embodiment, the OPC parameters are received in a data file, such as a text file or an XML file.

The system then dissects the polygon edges into OPC segments at dissection points (step 706). This is done in accordance with the OPC parameters. For example, the parameters might specify that segments are to be dissected and evaluated every 120 nm, but that segments on inside corners are to be dissected every 60 nm. Next, the system places evaluation points for each OPC segment (step 708). In another embodiment, the evaluation and dissection point selection approach described in U.S. patent application Ser. No. 09/676,356 entitled "Selection of Evaluation Point Locations Based on Proximity Effects Model Amplitudes for Correcting Proximity Effects in a Fabrication Layout" having inventors Youping Zhang et al., filed 29 Sep. 2000 and assigned to the assignee of the present application is used at step 708.

The system then selects a segment for evaluation (step 710).

The process then proceeds in a double loop. The inner loop evaluates each segment once and decides whether or not to perform a correction (steps 710–718), and the outer loop monitors the overall process and limits the computational time (steps 710–724). These steps are described in more detail below.

At step 710, a segment is selected. Next, the system calculates a critical dimension (CD) error at the evaluation point on the selected segment (step 712). This can be done by evaluating the optical model of the lithography process at the evaluation point. The system then determines whether to correct the segment on this iteration through the inner loop (step 714).

If the system decides to correct the segment on this iteration at step 714, the system calculates the edge bias to apply on this iteration (step 716). Note that the system considers spacing constraints in calculating the edge bias in a process that is described in more detail below with reference to FIG. 8. If no correction is be performed in this iteration, the process continues at step 718. Note that the amount of bias that can be applied to an edge segment in a single iteration may be limited according to the OPC parameters received at step 704. For example, a single edge may be outwardly biased on one iteration, e.g. +5 nm and then further biased on a subsequent iteration.

At step 718, if there are more segments to process in this iteration of the inner loop, the process continues at step 710. Otherwise, the system proceeds to update the layout with the edge biases that have been calculated for each segment (step 720).

Finally, the system determines if stopping criteria have been satisfied (step 724). If not, the system returns to step 710 for another iteration. Otherwise, the process ends. The stopping criteria can include, reaching a preset maximum number of iterations, all segments reaching a maximum correction, exhaustion of allowed computational time, all segments being fully corrected, some segments are determined to be non-correctable or not further correctable for certain reason (.e.g, low contrast), and/or combinations of one or more stopping criterion.

Adjusting Edge Biases Based Upon Spacing/Width Constraints

Figure 8:
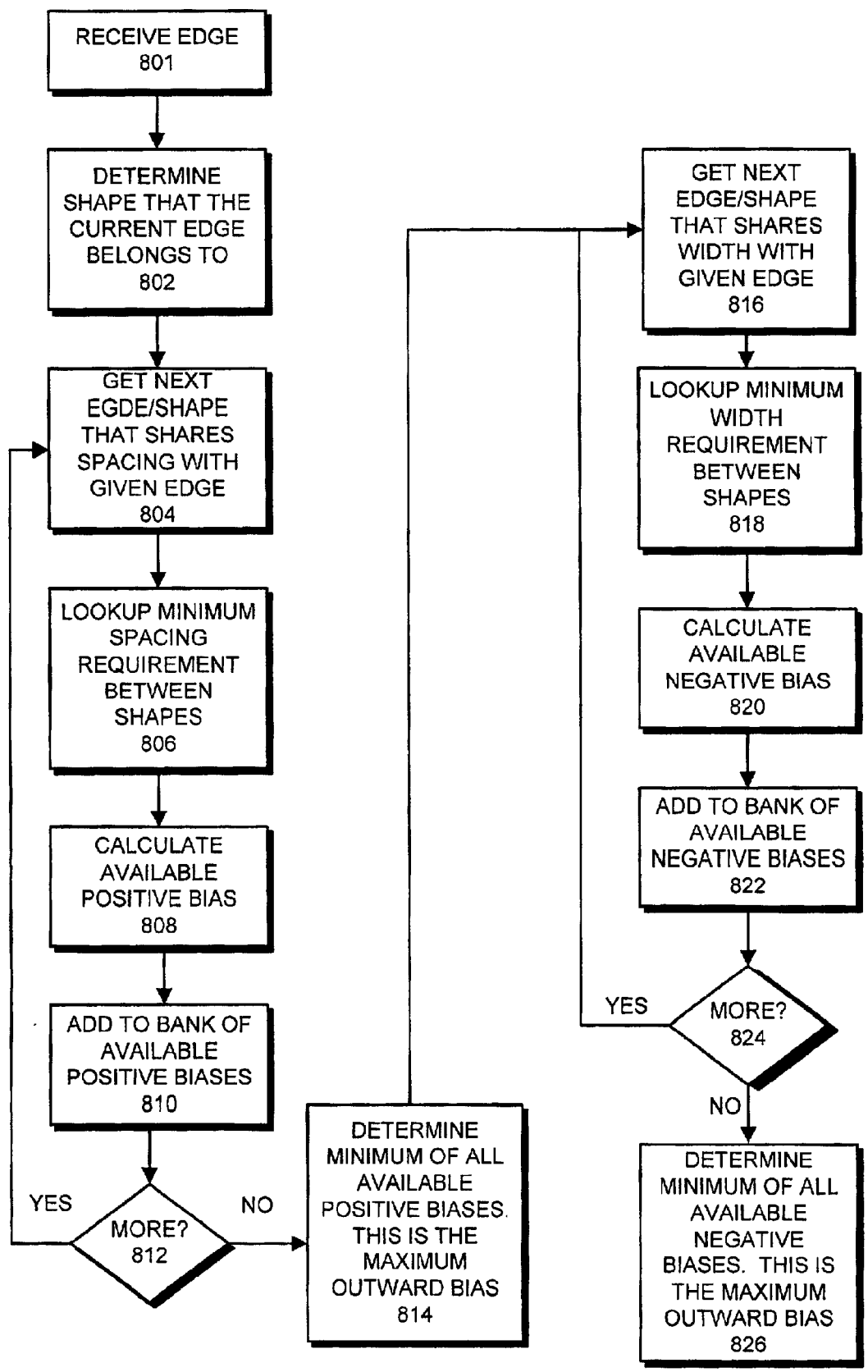
FIG. 8 is a flow chart illustrating the process of considering spacing constraints and width constraints during the optical proximity correction process in accordance with an embodiment of the invention.

FIG. 8 is a flow chart illustrating the process of adjusting edge biases based upon spacing constraints and width constraints in accordance with an embodiment of the invention. The system starts by receiving a current edge with an associated bias (step 801). Next, the system determines the shape that the current edge belongs to (step 802).

The system then gets the next relevant edge/shape that shares spacing with the current edge (step 804). Relevant edges/shapes are those that share immediate space and width with the current edge under consideration, i.e., any edges whose movement could potentially result in spacing violation (see FIG. 13). Relevant edges can be determined based on distance and the type of neighboring edge. The system then looks up the minimum spacing requirements between the shapes (step 806), and calculates an available positive bias between the edges (step 808). The system adds this positive bias to a bank of positive biases (step 810). The system then determines if there are remaining edges (step 812). If so, the system repeats steps 804, 806, 808 and 810 for all relevant edges with spacing interactions.

Figure 9:
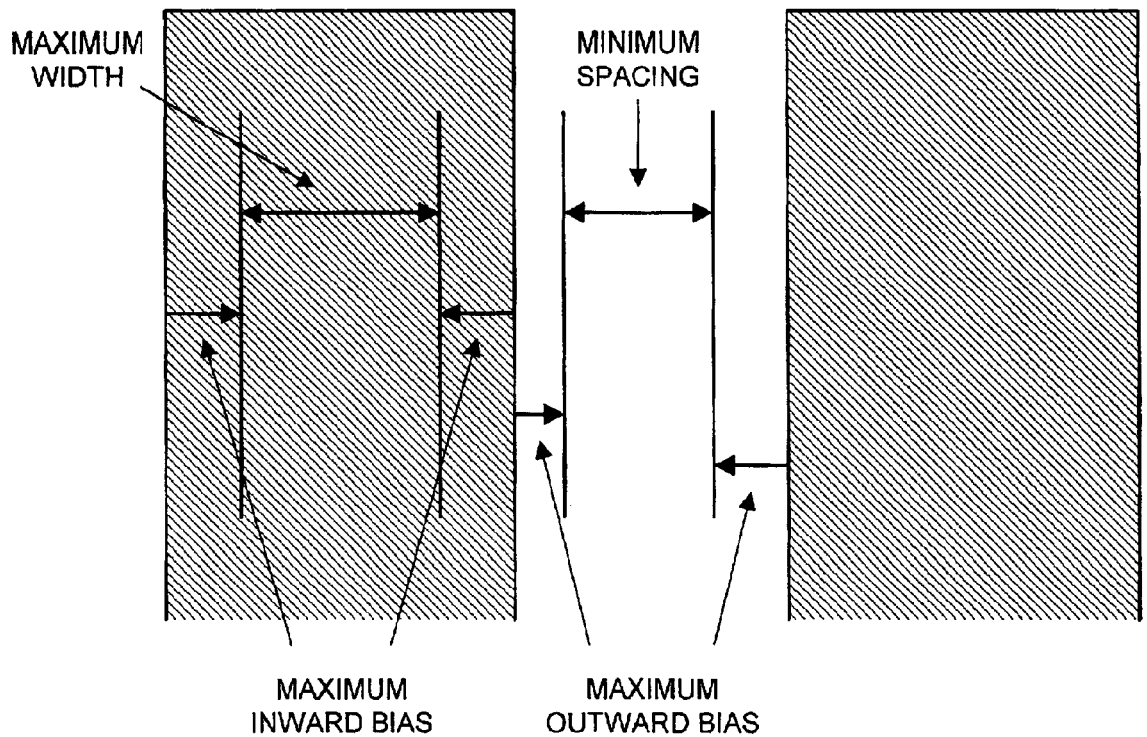
FIG. 9 illustrates minimum width and minimum spacing requirements.

If not, the system determines the minimum of all available positive biases (step 814) and uses this as the maximum outward bias (see FIG. 9).

The system subsequently gets the next edge/shape that shares width with the current edge (step 816). The system looks up the minimum width requirement between the interacting shapes (step 818), and then calculates available negative bias between the edges (step 820). The system adds this negative bias to a bank of negative biases (step 822). The system then determines if there are remaining edges (step 824). If so, the system repeats steps 816, 818, 822 and 822 for all relevant edges.

If not, the system determines the minimum of all available negative biases (step 826) and uses this as the maximum inward bias (see FIG. 9).

Although FIG. 8 is described as taking place within step 716 in FIG. 7, it does not necessarily have to happen at this step. The process described in FIG. 8 is an independent step that determines maximum bias values, and may take place anywhere before step 716 and after step 720 in FIG. 7 if it takes place in the loop.

Figure 1:
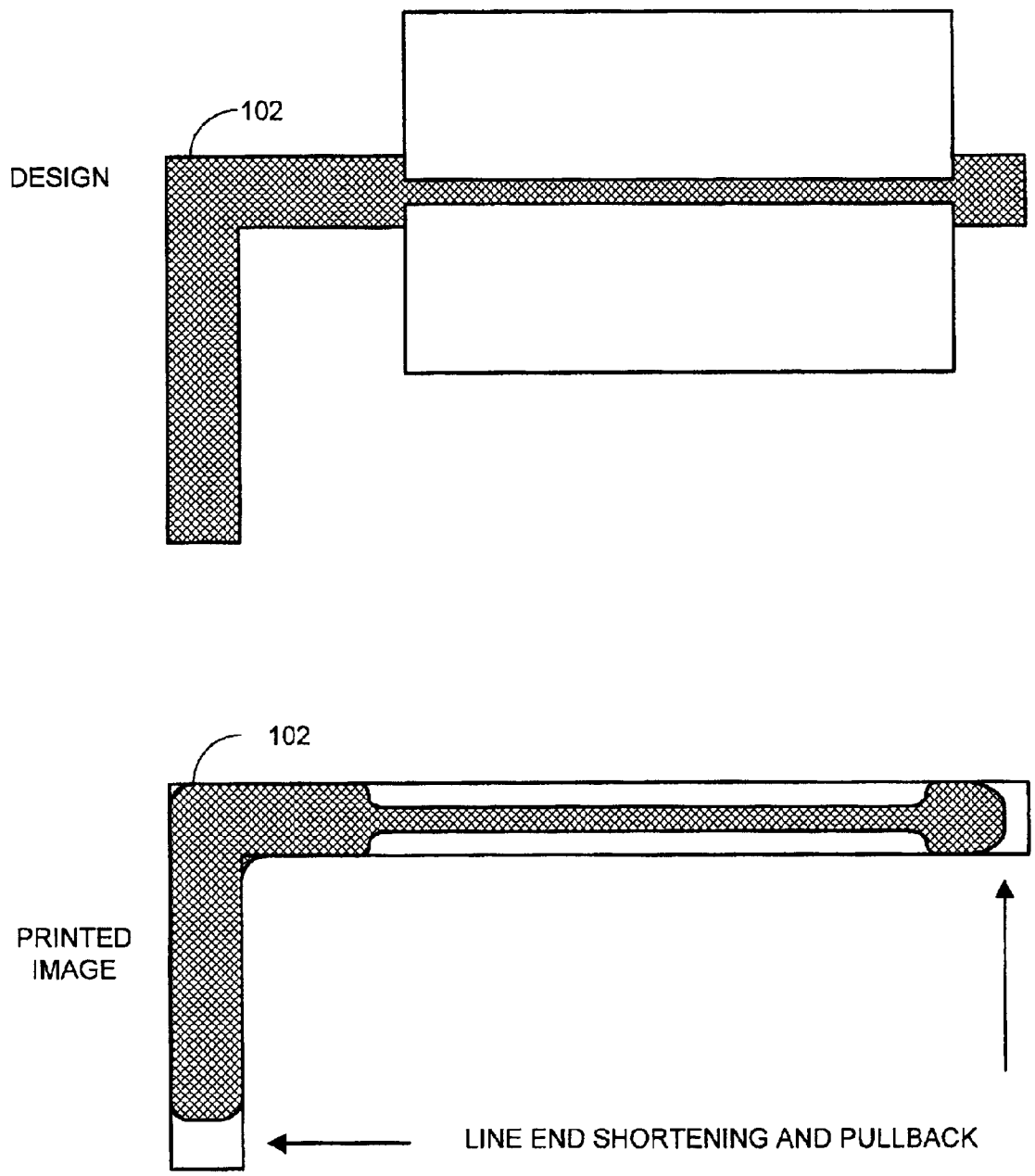
FIG. 1 illustrates the line end shortening problem.
Figure 2:
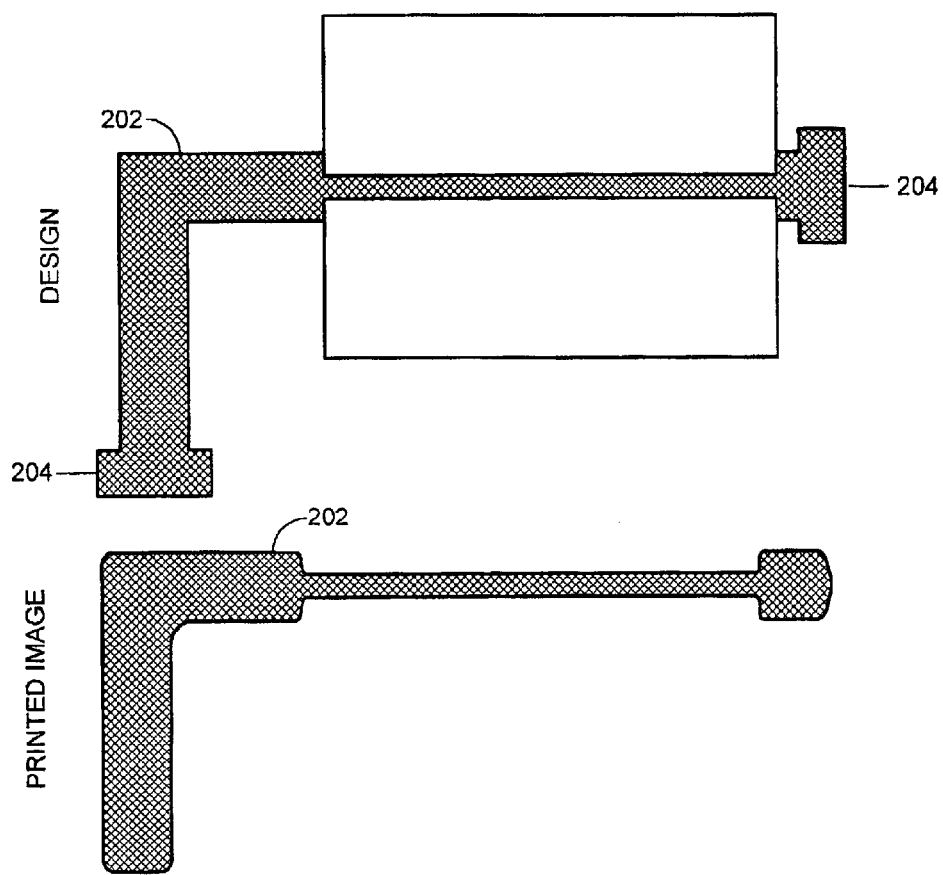
FIG. 2 illustrates the use of a hammerhead to compensate for the line end shortening problem.
Figure 3:
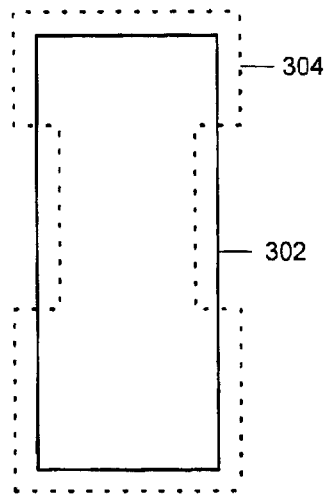
FIG. 3 illustrates line end geometry prior to and after optical proximity correction.
Figure 4A:
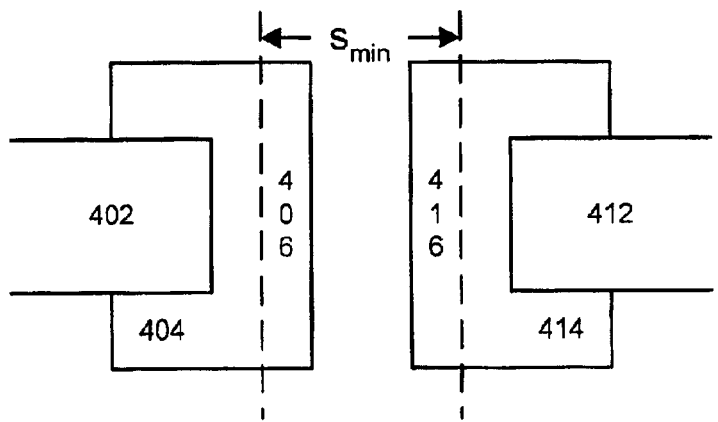
FIG. 4A illustrates how design rule checking is applied to ensure a minimum separation.

Note that the above-described process can satisfy spacing constraints without adversely affecting optical proximity correction. For example, referring the FIG. 4C, an "available bias" that remains after considering the minimum spacing constraint is allocated between line ends 402 and 412. Unlike the example in FIG. 4A, hammerheads 404 and 406 are not simply chopped off during a subsequent DRC operation. The resulting hammerheads 408 and 418 are instead modified to be larger in the vertical direction to compensate for a reduction of size the horizontal direction. This modification achieves a similar level of optical proximity correction while satisfying the minimum spacing requirement between line ends 402 and 412.

Figure 4B:
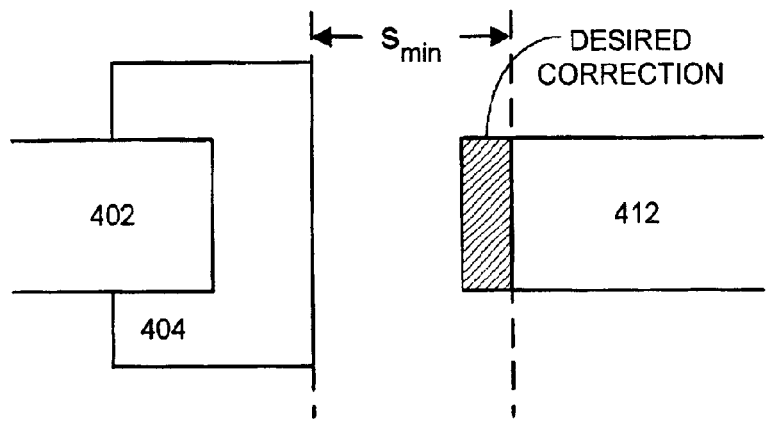
FIG. 4B illustrates how a spacing constraint can stop edge movement during OPC.
Figure 4C:
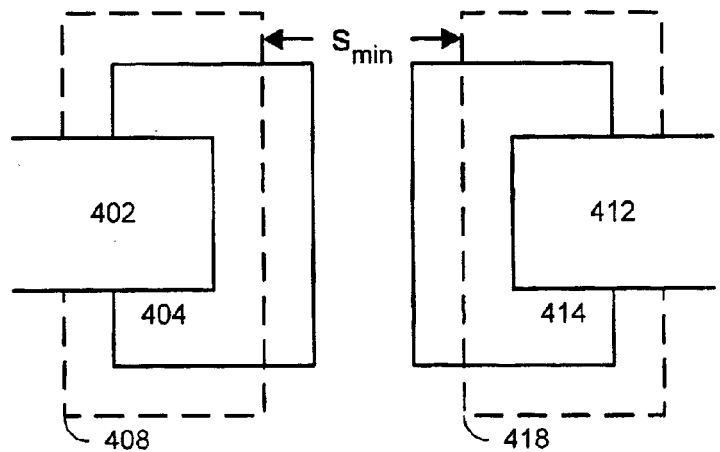
FIG. 4C illustrates how minimum separation is achieved without adversely affecting optical proximity correction in accordance with an embodiment of the invention.

Furthermore, unlike the example illustrated in FIG. 4B, the optical proximity correction is allocated symmetrically between line ends 402 and 412. (Although asymmetric allocations are also possible depending upon the requirements of the situation.)

EXAMPLES

Figure 10:
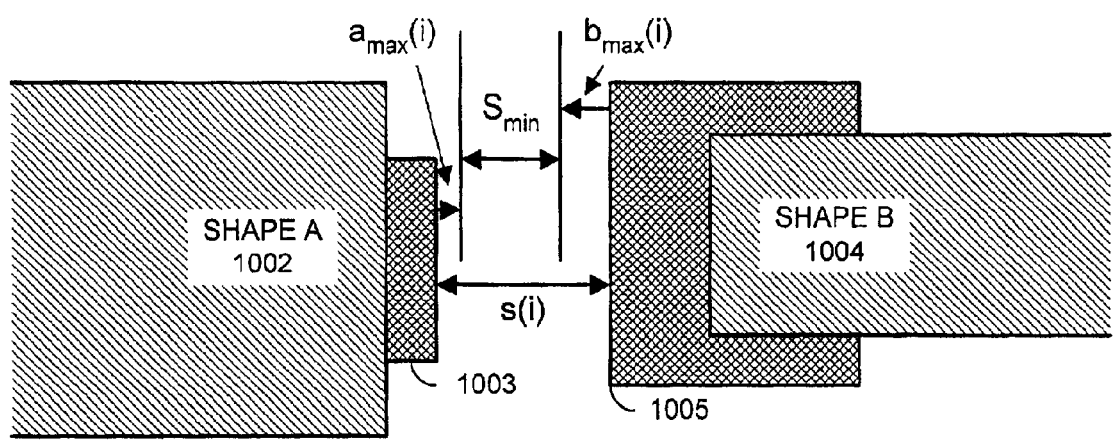
FIG. 10 illustrates an exemplary bias computation in accordance with an embodiment of the invention.

FIG. 10 illustrates an exemplary bias correction in accordance with an embodiment of the invention. In this example, an edge of shape A 1002 is in close proximity to an edge of shape B 1004. In this case, the system looks up a minimum spacing, $s_{min}$, between shape A 1002 and shape B 1004. Recall that $s_{min}$ can depend upon the types of shapes that are involved.

Next, the system performs an iterative process to produce the correction. For each iteration, i, the system considers an existing correction 1003 for shape A 1002, and an existing correction 1005 for shape B 1004. The system then calculates a maximum update, $a(i)_{max}$, for correction 1003, and a maximum update, $b(i)_{max}$, for correction 105. For example, these maximum updates can be computed using the following formulas:

$$a(i)_{max}=(s(i)-s_{min})\times r_a/(r_a+r_b); \text{ and}$$

$$b(i)_{max}=(s(i)-s_{mim})\times r_b/(r_a+r_b).$$

Note that these formulas make use of coefficients $r_a$ and $r_b$ that specify a relative weighting for corrections between shape A 1002 and shape B 1004. These coefficients $r_a$ and $r_b$ can depend upon shape information.

The ratios are used to compromise between the two feature's available spaces for corrections. Note that only the relative value of $r_a$ and $r_b$, $r_a:r_b$, is important, not their absolute values. The simplest case is to choose $r_a=1$ and $r_b=1$, i.e., shape A and shape B split the available spacing at all time. In one implementation, the ratios are initially chosen so that they favor those features whose accuracy is relatively more important over those less important. The ratios then gradually migrate toward favoring the features that need further corrections.

Consider an example. Suppose shape A is an edge, shape B is a line end, and we favor edges over line ends. Then the initial values of the ratios may be selected as, say $r_a=4$, $r_b=1$, i.e., for every 5 nm of available spacing, 4 nm is assigned to the edge and 1 nm is assigned to the line end. As the correction continues, it turns out that the edge quickly meets its spec by proper biasing while the line end is still missing the spec due to insufficient biasing due to spacing constraints. When there is still spacing left to be assigned, the favor turns toward the line end, e.g., $r_a=1$, $r_b=4$. One such formula, for example, can be as follows:

$$r_a(i)=\lambda_a(i)r_a(0)+(\lambda_a(0)-\lambda_a(i))\delta_a(i)$$

$$r_b(i)=\lambda_b(i)r_b(0)+(\lambda_b(0)-\lambda_b(i))\delta_b(i)$$

$$\lambda_a(i)=\lambda_a(0)e^{-k_a 1}$$

$$\lambda_b(i)=\lambda_b(0)e^{-k_b 1}$$

where $r_a(0)$, $r_b(0)$ are provided by user to specify initial preferences and $\delta_a(i)$, $\delta_b(i)$ represent how far the critical dimensions are from spec or the assigned biases are from the asked biases (i.e., biases would have been applied without spacing constraint). The coefficient $\lambda_a(i)$, $\lambda_b(i)$ are weighted toward initial assignments $r_a(0)$, and $r_b(0)$, and gradually migrate toward needs (until finally they completely depend on needs).

There could also be cases where a user absolutely requires edges meet specifications before considering line end. This can be treated by using the same formula, where we simply set $r_a(0)>>r_b(0)$ and $\lambda_a(0)>>\lambda_b(0)$.

These maximum updates, $a(i)_{max}$ and $b(i)_{max}$, are then used to update corrections 1003 and 1005, respectively. The process is repeated until either, all of the necessary corrections are made, a correction limit is reached, or an iteration limit is reached.

Figure 11:
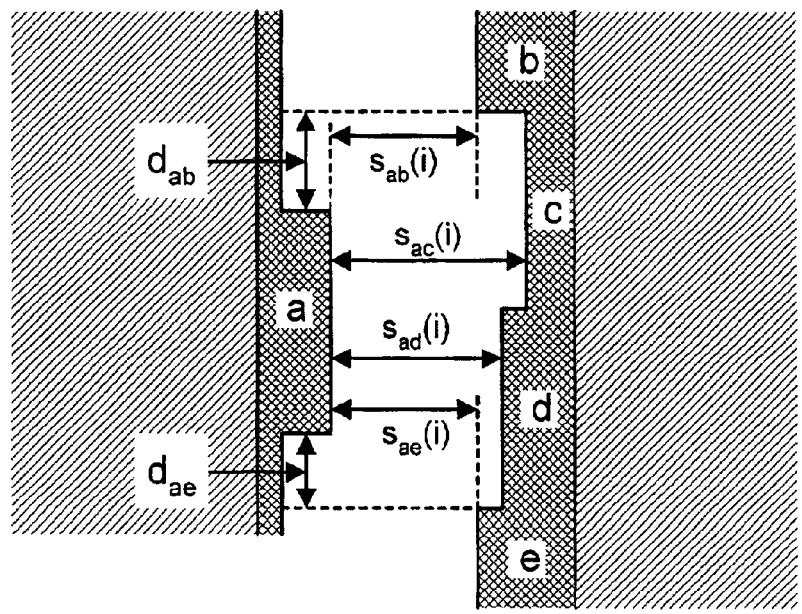
FIG. 11 illustrates another exemplary bias computation in accordance with an embodiment of the invention.

FIG. 11 illustrates another exemplary bias correction in accordance with an embodiment of the invention. In this example, an edge a interacts with multiple edges, b, c, d, and e. In this case, the system determines an available bias for each of the four interactions, and selects the smallest of these as the maximum outward correction to constraint the available biasing for edge a. In the case of edges a and b, the two shapes are not facing each other like in FIG. 10. Determining available bias has to take into account the effects of corners. For example, the available bias between edge a and edge b can be computed using the following distance formula:

available_bias(a,b)=OPC maximum adjustment parameter if $d_{ab} \geq s_{min}$; and $$\sqrt{s_{ab} - \sqrt{s_{min}^2 - d_{ab}^2}} \; \frac{r_a}{r_a+r_b} \text{ if } d_{ab} < s_{min}$$

Note that $s_{ab}$ represents a horizontal distance between edges a and b, and $d_{ab}$ represents a vertical distance between edges a and b. Furthermore, note that the available bias for the other three edges c, d and e can be computed similarly. This available bias is then used to update the bias for edge a in an iterative process which is similar to the single interaction case described above with reference to FIG. 10.

Figure 12:
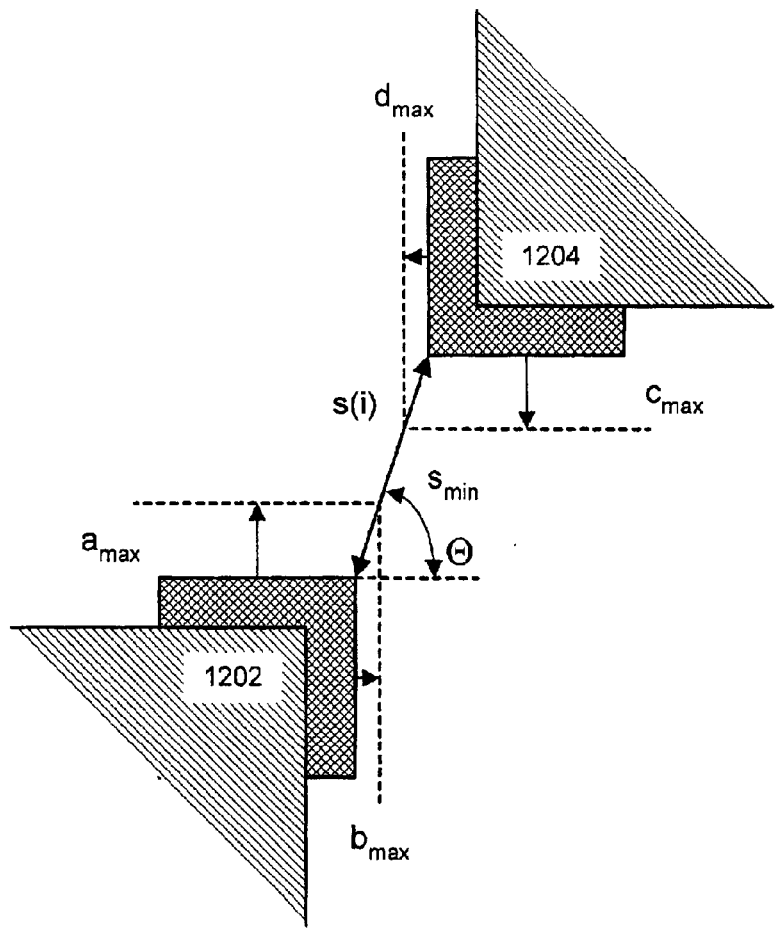
FIG. 12 illustrates yet another exemplary bias computation in accordance with an embodiment of the invention.

FIG. 12 illustrates yet another exemplary bias correction in accordance with an embodiment of the invention. This example illustrates an interaction between edges of a corner 1202 and a corner 1204. Note that the optical proximity correction for corner 1202 includes a vertical correction associated with $a_{max}$ and a horizontal correction associated with $b_{max}$. Similarly, the optical proximity correction for corner 1204 involves a vertical correction associated with $c_{max}$ and a horizontal correction associated with $d_{max}$. The corrections $a_{max}$, $b_{max}$, $c_{max}$, and $d_{max}$ can be calculated by the following formulas, wherein $\Theta$ is the angle between a line that connects the corners and a horizontal line:

$$b_{max}=(s(i)-s_{min})\times r_a/(r_a+r_b)\sin\Theta;$$

$$a_{max}=(s(i)-s_{min})\times r_a/(r_a+r_b)\cos\Theta;$$

$$d_{max}=(s(i)-s_{min})\times r_d/(r_c+r_d)\sin\Theta; \text{ and}$$

$$c_{max}=(s(i)-s_{min})\times r_c/(r_c+r_d)\cos\Theta.$$

The quantities $a_{max}$, $b_{max}$, $c_{max}$, and $d_{max}$ are then used to update the optical proximity corrections for corners 1202 and 1204. The above formula requires that the angle, $\Theta$, be maintained as a constant. This may be a desirable limitation on the application of OPC, alternatively other constraints can be used and the equations factored to account for changes in the angle, $\Theta$.

Figure 13:
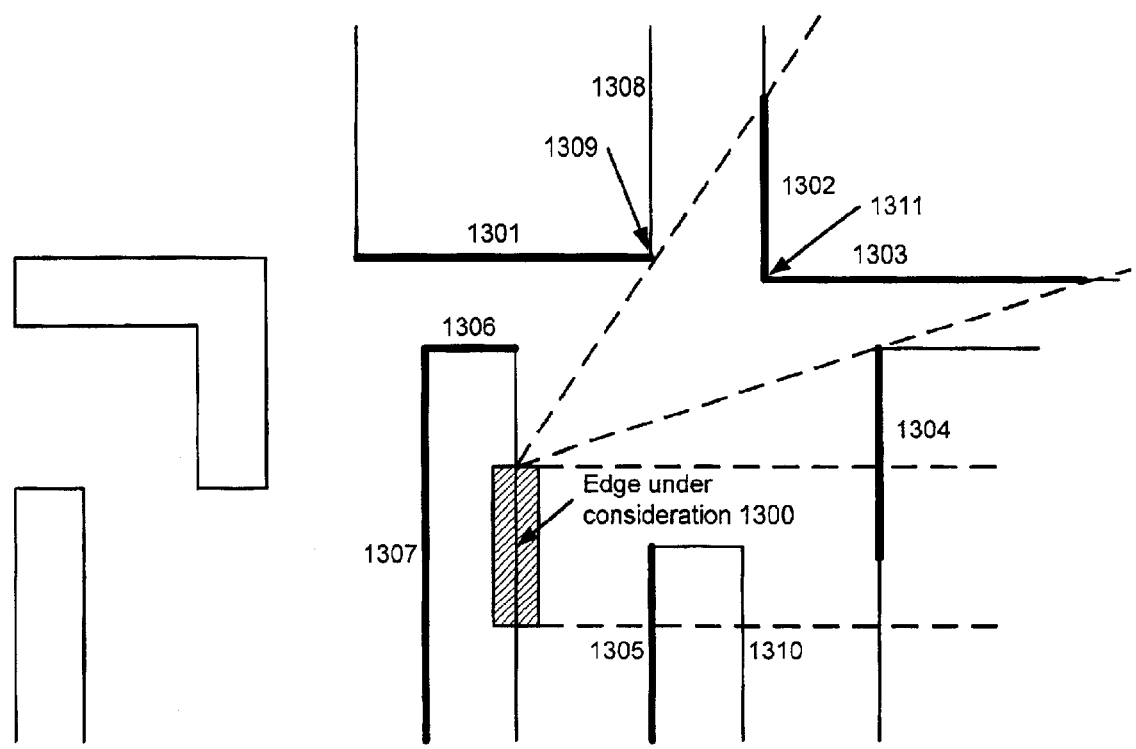
FIG. 13 illustrates a set of relevant edges an embodiment of the invention.

FIG. 13 illustrates how a number of relevant edges 1301–1307 are identified from an edge under consideration 1300. To determine which edges will interact due to minimum spacing requirements, lines are projected in horizontal and vertical directions from the edge under consideration 1300 to find relevant edges 1301–1305. To determine edges that will interact due to minimum width requirements, lines are projected into the interior of the geometry from the edge under consideration 1300 to find relevant edges 1306–1307. Illustrated by dashed lines. Specifically, edges 1304 and 1305 share immediate spacing with 1300 as part of those edges project directly into 1300 (facing each other). Edges 1302 and 1303 share spacing with 1300 because the corner 1311 can grow towards 1300. Edge 1308 does not interact with edge 1300 directly as it is behind corner 1309. Similarly, edge 1310 is not relevant for computing the spacing of edge 1300. Widths are handled in a similar fashion.

Figure 14:
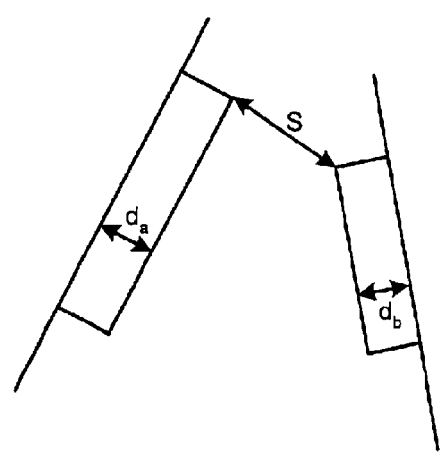
FIG. 14 illustrates a two-edge interaction in accordance with an embodiment of the invention.
Figure 15:
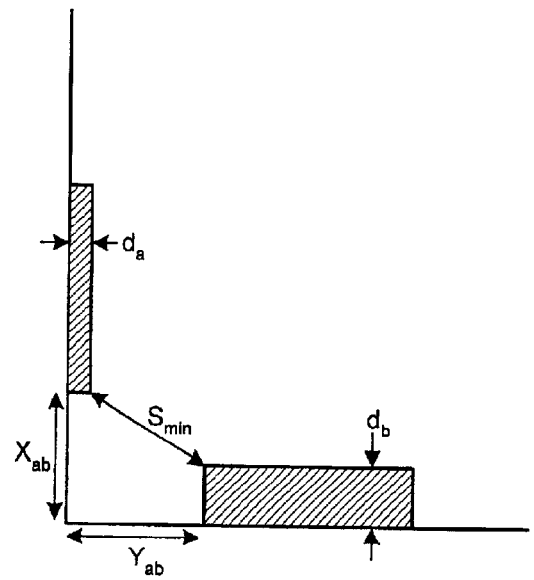
FIG. 15 illustrates another two-edge interaction in accordance with an embodiment of the invention.

Referring to FIG. 14, any two-edge interaction can be processed in the following manner. Suppose $d_a$ and $d_b$ are applied. Calculate the minimum distance after the correction $s=f(d_a,d_b)$. Then set $s=s_{min}$ and substitute $d_a/d_b=r_a/r_b$, and solve for $d_a$ and $d_b$, which will be the available maximum correction for this particular edge interaction. For example, in the case illustrated in FIG. 15, available biases are calculated using the following equations:

$$(y_{ab}-d_a)^2+(x_{ab}-d_b)^2=s_{min}^2$$

$$d_a/d_b=r_a/r_b$$

Figure 16:
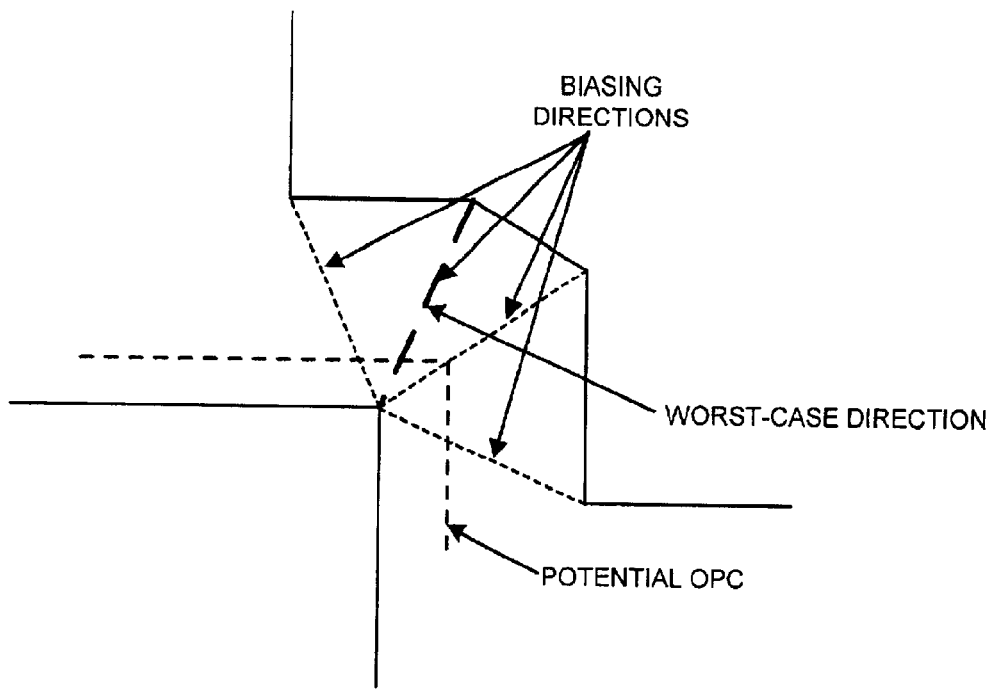
FIG. 16 illustrates a multi-edge interaction in accordance with an embodiment of the invention.

For any multi-edge shape interaction, the system first determines the direction that will shorten the spacing the fastest (see FIG. 16). The system assumes biasing in this worst-case direction to calculate the "worst-case" spacing value. Next, the system sets the ratio among edges in the shape to be along that direction and then calculates distance assuming biasing along the worst-case direction. More specifically, the system sets the spacing value to $s_{min}$, and applies the ratio to solve for the biasing along this worst-case direction. Next, the system distributes the biasing between the affected edges. Note that this process is iterative so the worst case biasing direction can change for subsequent iterations. Also note that bias computations are performed one edge at a time. At times when an edge simultaneously belongs to two corners (e.g. line end) the above operation (multi-edge shape interaction) has to be performed twice, once for each corner. Although the bias computations for an edge take into consideration interactions with other edges, biasing for these other edges is not affected by the bias computations for the edge. The technique described above can also be applied to minimum width requirements.

It can be proven that as the number of iterations grows, this method is non-conservative, i.e., the final biasing will use up the available spacing or width to achieve the best possible OPC results.

Figure 17:
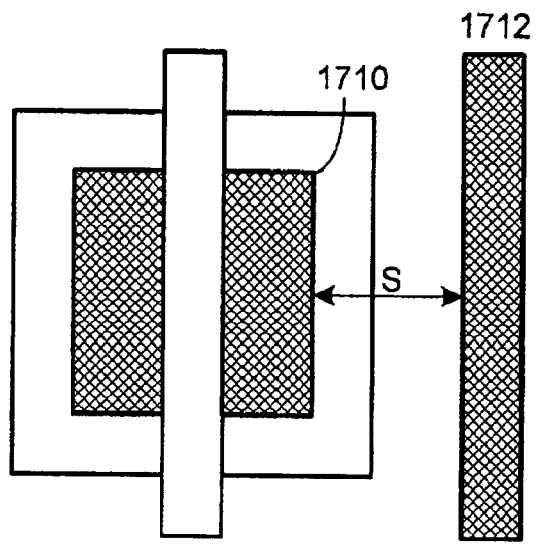
FIG. 17 illustrates a biasing example that depends upon the type of geometries involved in accordance with an embodiment of the invention.

Biasing ratios can also depend upon shape information and the type of geometries involves. For example, FIG. 17 illustrates a minimum spacing requirement along the line, S, between trim region 1710 for a gate region of a transistor and a neighboring wire 1712. However, the dimensions of trim region 1710 cannot change. Hence, the biasing will only be applied to the wire 1712.

Figure 18:
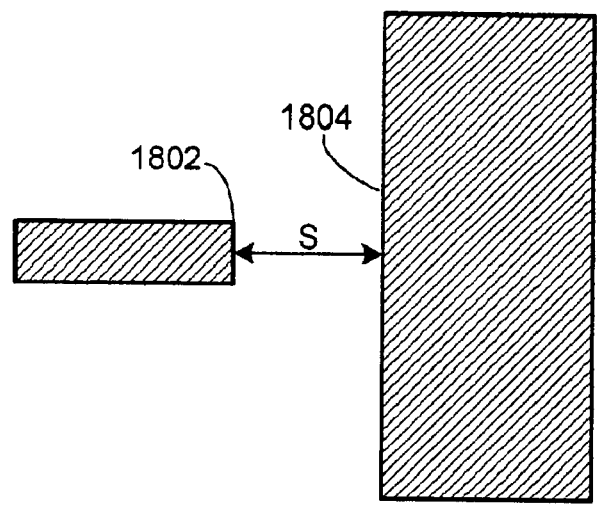
FIG. 18 illustrates a biasing example that depends upon shape information in accordance with an embodiment of the invention.

In another example illustrated in FIG. 18, there is a minimum spacing requirement along the line, S, between line end 1802 and edge 1804. In this example, biasing can be applied in different ratios between line end 1802 and edge 1804 based on shape information.

Figure 19:
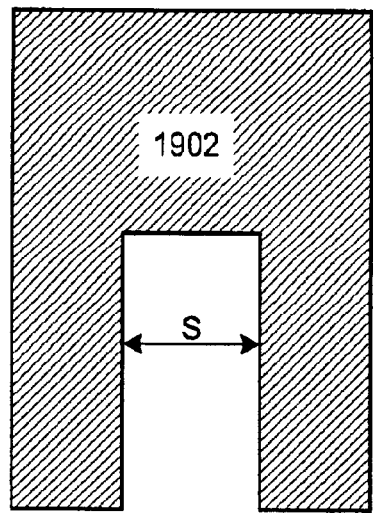
FIG. 19 illustrates a minimum spacing requirement across a gap between portions of the same feature in accordance with an embodiment of the invention.

In yet another example illustrated in FIG. 19, there is a minimum spacing requirement along the line, S, between a first edge of feature 1902 and a second edge of feature 1902 across a gap between portions of feature 1902.

Figure 20:
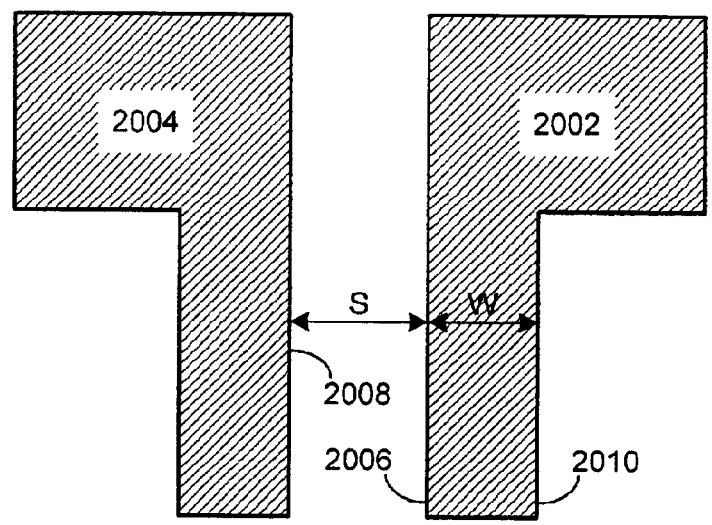
FIG. 20 illustrates a situation in which both a minimum spacing requirement and a minimum width requirement must be satisfied in accordance with an embodiment of the invention.

In a further example illustrated in FIG. 20, there is a minimum spacing requirement to satisfy along the line, S, between an edge 2006 of feature 2002 and an edge 2008 of feature 2004. At the same time, there is a minimum width requirement to satisfy along the line, W, between edge 2006 of feature 2002 and an opposing edge 2010 of feature 2002.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method that facilitates one or more of minimum spacing and width control during an optical proximity correction operation for a mask that is used in manufacturing an integrated circuit, the method comprising:

considering a target edge of a first feature on the mask;

identifying a set of interacting edges in proximity to the target edge; and performing the optical proximity correction operation, wherein performing the optical proximity correction operation involves applying a first edge bias to the target edge to compensate for optical effects in a resulting image of the target edge;

wherein applying the first edge bias to the target edge involves:

calculating an available bias based on minimum spacing requirements and/or minimum width requirements, and allocating the available bias between the first edge bias for the target edge and a second edge bias for at least one edge in the set of interacting edges; and wherein the available bias is allocated based on relative weights assigned to the target edge and the second edge.

2. The method of claim 1, wherein applying the first edge bias can involve adding a positive edge bias that increases the size of the first feature or adding a negative edge bias that decreases the size of the first feature.

3. The method of claim 1, wherein the second edge belongs to a second feature so that the distance between the target edge and the second edge defines a distance between the first feature and the second feature;

wherein applying the first edge bias to the target edge involves satisfying a minimum spacing requirement between the target edge and the second edge.

4. The method of claim 3, wherein applying the first edge bias to the target edge additionally involves satisfying a minimum width requirement between the target edge and an opposing edge of the first feature.

5. The method of claim 1, wherein the second edge is also an edge of the first feature so that a distance between the target edge and the second edge defines a distance across a gap between portions of the first feature.

6. The method of claim 1, wherein the second edge is an opposing edge of the first feature so that a distance between the target edge and the opposing edge defines a width of the first feature; and wherein applying the first edge bias to the target edge involves satisfying a minimum width requirement for the first feature between the target edge and the second edge.

7. The method of claim 1, wherein applying the first edge bias to the target edge involves considering an edge type of the target edge and considering an edge type of the second edge.

8. The method of claim 1, wherein allocating the available bias between the target edge and the second edge involves ensuring that the first edge bias of the target edge satisfies a minimum spacing requirement between the target edge and each edge in the set of interacting edges.

9. The method of claim 1, wherein allocating the available bias between the target edge and the second edge involves ensuring that the first edge bias of the target edge satisfies a minimum width requirement between the target edge and each edge in the set of interacting edges.

10. The method of claim 1, wherein allocating the available bias involves iteratively updating bias allocated to the target edge and the second edge in a manner that satisfies minimum spacing requirements or minimum width requirements.

11. A computer-readable storage medium storing instructions that when executed by a computer cause the computer to perform a method that facilitates one or more of minimum spacing and width control during an optical proximity correction operation for a mask that is used in manufacturing an integrated circuit, the method comprising:

considering a target edge of a first feature on the mask;

identifying a set of interacting edges in proximity to the target edge; and performing the optical proximity correction operation, wherein performing the optical proximity correction operation involves applying a first edge bias to the target edge to compensate for optical effects in a resulting image of the target edge;

wherein applying the first edge bias to the target edge involves:

calculating an available bias based on minimum spacing requirements and/or minimum width requirements, and allocating the available bias between the first edge bias for the target edge and a second edge bias for at least one edge in the set of interacting edges; and wherein the available bias is allocated based on relative weights assigned to the target edge and the second edge.

12. The computer-readable storage medium of claim 11, wherein applying the first edge bias can involve adding a positive edge bias that increases the size of the first feature or adding a negative edge bias that decreases the size of the first feature.

13. The computer-readable storage medium of claim 11, wherein the second edge belongs to a second feature so that the distance between the target edge and the second edge defines a distance between the first feature and the second feature;

wherein applying the first edge bias to the target edge involves satisfying a minimum spacing requirement between the target edge and the second edge.

14. The computer-readable storage medium of claim 13, wherein applying the first edge bias to the target edge additionally involves satisfying a minimum width requirement between the target edge and an opposing edge of the first feature.

15. The computer-readable storage medium of claim 11, wherein the second edge is also an edge of the first feature so that a distance between the target edge and the second edge defines a distance across a gap between portions of the first feature.

16. The computer-readable storage medium of claim 11, wherein the second edge is an opposing edge of the first feature so that a distance between the target edge and the opposing edge defines a width of the first feature; and wherein applying the first edge bias to the target edge involves satisfying a minimum width requirement for the first feature between the target edge and the second edge.

17. The computer-readable storage medium of claim 11, wherein applying the first edge bias to the target edge involves considering an edge type of the target edge and considering an edge type of the second edge.

18. The computer-readable storage medium of claim 11, wherein allocating the available bias between the target edge and the second edge involves ensuring that the first edge bias of the target edge satisfies a minimum spacing requirement between the target edge and the second edge.

19. The computer-readable storage medium of claim 11, wherein allocating the available bias between the target edge and the second edge involves ensuring that the first edge bias of the target edge satisfies a minimum width requirement between the target edge and each edge in the set of interacting edges.

20. The computer-readable storage medium of claim 11, wherein allocating the available bias involves iteratively updating bias allocated to the target edge and the second edge in a manner that satisfies minimum spacing requirements or minimum width requirements.

21. An apparatus that facilitates minimum spacing or width control during an optical proximity correction operation for a mask that is used in manufacturing an integrated circuit, the apparatus comprising:

an identification mechanism that is configured to identify a set of interacting edges in proximity to a target edge of a first feature; and an optical proximity correction mechanism that is configured to perform the optical proximity correction operation, wherein the optical proximity correction mechanism is configured to add a first edge bias to the target edge to compensate for optical effects in a resulting image of the target edge;

wherein applying the first edge bias to the target edge involves calculating an available bias based on minimum spacing requirements and/or minimum width requirements;

wherein the optical proximity correction mechanism is configured to allocate the available bias between the first edge bias for the target edge and a second edge bias for at least one edge in the set of interacting edges; and wherein the available bias is allocated based on relative weights assigned to the target edge and the second edge.

22. The apparatus of claim 21, wherein applying the first edge bias can involve adding a positive edge bias that increases the size of the first feature or adding a negative edge bias that decreases the size of the first feature.

23. The apparatus of claim 22, wherein the second edge belongs to a second feature so that the distance between the target edge and the second edge defines a distance between the first feature and the second feature;

wherein while adding the first edge bias, the optical proximity correction mechanism is configured to satisfy a minimum spacing requirement between the target edge and the second edge.

24. The apparatus of claim 23, wherein while adding the first edge bias to the target edge, the optical proximity correction mechanism is configured to satisfy a minimum width requirement between the target edge and an opposing edge of the first feature.

25. The apparatus of claim 21, wherein the second edge is also an edge of the first feature so that a distance between the target edge and the second edge defines a distance across a gap between portions of the first feature.

26. The apparatus of claim 21, wherein the second edge is an opposing edge of the first feature so that a distance between the target edge and the opposing edge defines a width of the first feature; and wherein while adding the first edge bias, the optical proximity correction mechanism is configured to satisfy a minimum width requirement for the first feature between the target edge and the second edge.

27. The apparatus of claim 21, wherein while adding the first edge bias, the optical proximity correction mechanism is configured to consider an edge type of the target edge and to consider an edge type of the second edge.

28. The apparatus of claim 21, wherein while adding the first edge bias, the optical proximity correction mechanism is configured to ensure that the first edge bias of the target edge satisfies a minimum spacing requirement between the target edge and the second edge.

29. The apparatus of claim 21, wherein while adding the first edge bias, the optical proximity correction mechanism is configured to ensure that the first edge bias of the target edge satisfies a minimum width requirement between the target edge and each edge in the set of interacting edges.

30. The apparatus of claim 21, wherein while allocating the available bias, the optical proximity correction mechanism is configured to iteratively update bias allocated to the target edge and the second edge in a manner that satisfies minimum spacing requirements or minimum width requirements.

31. A means for facilitating minimum spacing or width control during an optical proximity correction operation for a mask that is used in manufacturing an integrated circuit, comprising:

an identification means that is configured to identify a set of interacting edges in proximity to the target edge of a first feature; and an optical proximity correction means for performing the optical proximity correction operation, wherein performing the optical proximity correction operation involves applying a first edge bias to the target edge to compensate for optical effects in a resulting image of the target edge;

wherein while applying the first edge bias to the target edge, the optical proximity correction means is configured to:

calculate an available bias based on minimum spacing requirements and/or minimum width requirements, and allocate the available bias between the first edge bias for the target edge and a second edge bias for at least one edge in the set of interacting edges; and wherein the available bias is allocated based on relative weights assigned to the target edge and the second edge.

32. A method of manufacturing an integrated circuit product that facilitates minimum spacing or width control during an optical proximity correction operation for a mask used in manufacturing the integrated circuit, the method comprising:

considering a target edge of a first feature on the mask;

identifying a set of interacting edges in proximity to the target edge; and performing the optical proximity correction operation, wherein performing the optical proximity correction operation involves applying a first edge bias to the target edge to compensate for optical effects in a resulting image of the target edge;

wherein applying the first edge bias to the target edge involves:

calculating an available bias based on minimum spacing requirements and/or minimum width requirements, and allocating the available bias between the first edge bias for the target edge and a second edge bias for at least one edge in the set of interacting edges; and wherein the available bias is allocated based on relative weights assigned to the target edge and the second edge.

* * * * *

UNITED STATES PATENT AND TRADEMARK OFFICE
CERTIFICATE OF CORRECTION

PATENT NO. : 6,753,115 B2
DATED : June 22, 2004
INVENTOR(S) : Zhang et al.

It is certified that error appears in the above-identified patent and that said Letters Patent is hereby corrected as shown below:

Column 14,
Line 65, after claim 32, please add the claim:

— "A mask used in fabricating an integrated circuit, wherein the mask is created through a method that facilitates minimum spacing or width control during an optical proximity correction operation for the mask, the method comprising:
 considering a target edge of a first feature on the mask;
 identifying a set of interacting edges in proximity to the target edge; and
 performing the optical proximity correction operation, wherein performing the optical proximity correction operation involves applying a first edge bias to the target edge to compensate for optical effects in a resulting image of the target edge;
 wherein applying the first edge bias to the target edge involves:
  calculating an available bias based on minimum spacing requirements and/or minimum width requirements, and
  allocating the available bias between the first edge bias for the target edge and a second edge bias for at least one edge in the set of interacting edges; and
 wherein the available bias is allocated based on relative weights assigned to the target edge and the second edge." --

Signed and Sealed this

Twenty-third Day of November, 2004

JON W. DUDAS
*Director of the United States Patent and Trademark Office*